(12) United States Patent
Hirano et al.

(10) Patent No.: US 7,394,098 B2
(45) Date of Patent: Jul. 1, 2008

(54) THIN FILM TRANSISTOR, ITS MANUFACTURE METHOD AND DISPLAY DEVICE

(75) Inventors: Takuya Hirano, Kawasaki (JP); Takuya Watanabe, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 76 days.

(21) Appl. No.: 11/710,168

(22) Filed: Feb. 23, 2007

(65) Prior Publication Data
US 2007/0164287 A1 Jul. 19, 2007

Related U.S. Application Data

(62) Division of application No. 10/745,419, filed on Dec. 22, 2003, now Pat. No. 7,202,115.

(30) Foreign Application Priority Data
Dec. 24, 2002 (JP) .............................. 2002-372050

(51) Int. Cl.
*H01L 29/04* (2006.01)
(52) U.S. Cl. ............................ 257/59; 257/72; 257/350; 257/252; 257/E27.1
(58) Field of Classification Search ................. 257/347, 257/252, 368, 222, 228, E27.1, E27.112, 257/E27.125
See application file for complete search history.

(56) References Cited

U.S. PATENT DOCUMENTS 6,906,347 B2    6/2005    Yamazaki et al. ............. 257/72

FOREIGN PATENT DOCUMENTS

| JP | 6-291034 | | 10/1994 | |
| JP | 2002-050576 | * | 2/2002 | .................... 21/20 |

* cited by examiner

*Primary Examiner*—Howard Weiss
*Assistant Examiner*—(Vikki) Hoa B Trinh
(74) *Attorney, Agent, or Firm*—Greer, Burns & Crain, Ltd.

(57) ABSTRACT

On an insulating substrate, a first insulating buffer layer, a heat accumulating-light shielding layer having at least a silicon layer on the surface thereof, a second insulating buffer layer and a first silicon layer are laminated in the order recited from the bottom. The lamination structure of the heat accumulating-light shielding layer, second buffer layer and first silicon layer is patterned. A laser beam is applied the patterned first silicon layer to melt and crystallize the first silicon layer. A thin film transistor is formed by using the crystallized first silicon layer. A polysilicon thin film transistor of high performance and small leak current to be caused by light as well as a display device using such thin film transistors is provided.

3 Claims, 4 Drawing Sheets

THIN FILM TRANSISTOR, ITS MANUFACTURE METHOD AND DISPLAY DEVICE This is a divisional of application Ser. No. 10/745,419 filed Dec. 22, 2003 now U.S. Pat. No. 7,202,115

CROSS REFERENCE TO RELATED APPLICATION

This application is based on and claims priority of Japanese Patent Application No. 2002-372050 filed on Dec. 24, 2002, the entire contents of which are incorporated herein by reference.

BACKGROUND OF THE INVENTION

A) Field of the Invention

The present invention relates to thin film transistors, and more particularly to thin film transistors of polysilicon used with liquid crystal display devices or the like.

B) Description of the Related Art

A manufacture method for a thin film transistor is known which forms a thin film transistor by crystallizing an amorphous silicon layer by applying an XeCl excimer laser beam. The diameter of polycrystalline grains formed by applying an excimer laser beam is small. A thin film transistor made of polycrystals having a small diameter has the operation performance not good. If such thin film transistors are to be used with a display device such as a liquid crystal display device, they have been used as switching transistors of a pixel display unit.

Another manufacture method for a thin film transistor is known which forms a thin film transistor by crystallizing an amorphous silicon layer by applying a continuously oscillating laser beam. The diameter of polycrystalline grains formed by applying a continuously oscillating laser beam is large. A thin film transistor made of polycrystals having a large diameter has the good operation performance. If such thin film transistors are to be used with a display device such as a liquid crystal display device, they have been used as transistors of a peripheral circuit.

In order to have a large crystal grain diameter, it is necessary to make an amorphous silicon layer have some thickness. For example, if a thickness of an amorphous silicon layer is 100 nm or thinner, it is difficult to form polycrystals having an average crystal grain diameter of 1 μm or larger. The following methods have been used in order to thin an amorphous silicon layer.

FIG. 3 is a schematic cross sectional view illustrating one process of a conventional method of manufacturing a thin film transistor. Formed on a glass substrate 50 are a buffer layer 51, an absorption film 52, an interlayer film 53 and an amorphous silicon layer 54 stacked in this order from the bottom. For example, the buffer layer 51 is made of $SiO_2$, the absorption layer 52 is made of super elastic material such as Ti-15 Mo 0.18-O and has a thickness of 150 to 200 nm, the interlayer film 53 is made of $SiO_2$ and has a thickness of 200 nm, and the amorphous silicon layer 54 has a thickness of 50 nm.

A continuously oscillating Nd:YAG laser beam (wavelength: 1064 nm), for example, is applied to the surface of the amorphous silicon film 54 of the structure shown in FIG. 3, to heat the absorption layer 52. By utilizing heat in the absorption film 52, the amorphous silicon film 54 is crystallized.

After the amorphous silicon film 54 is crystallized by utilizing heat in the underlying absorption film 52, a gate insulating film and a gate electrode are formed. Then, source/drain ion implantation and LDD ion implantation are performed. An interlayer insulating film and source/drain electrodes are thereafter formed (for example, refer to Japanese Patent Laid-open Publication No. 2002-505760).

FIG. 4 is a schematic perspective view partially broken and showing an example of a liquid crystal display device using polysilicon thin film transistors. Liquid crystals 74 are held between a TFT array substrate 73 formed with thin film transistors and an opposing substrate 77 formed with a common electrode. The TFT array substrate 73 has a pixel display unit 76 and a peripheral circuit unit 75 formed in a peripheral area of the pixel display unit 76 for controlling the pixel display unit 76. Polarizing plates 72 and 78 are disposed sandwiching the TFT array substrate 73 and opposing substrate 77.

On the back of the polarizing plate 72 (on the side of the plate 72 opposite to the liquid crystals 74), a back light 71 is mounted. Leak current caused by light from the back light 71 flows in polysilicon thin film transistors on the TFT array substrate 73. Leak current becomes large as the active layer of a transistor becomes thick. Transistors having leak current larger than a certain amount cannot be used in practice.

A known method of reducing leak current forms offset or LDD regions. In this case, the transistor operation speed is limited. This approach is therefore unsuitable for transistors of a peripheral circuit.

SUMMARY OF THE INVENTION

An object of this invention is to provide a high quality thin film transistor and its manufacture method, particularly a high quality polysilicon thin film transistor having small leak current to be caused by light and its efficient manufacture method, and a display device using such polysilicon thin film transistors.

According to one aspect of the present invention, there is provided a method of manufacturing a thin film transistor comprising the steps of: laminating a first insulating buffer layer, a heat accumulating-light shielding layer having at least a silicon layer on a surface thereof, a second insulating buffer layer and a first silicon layer on an insulating substrate in a recited order from a bottom; pattering a lamination structure of the heat accumulating-light shielding layer, the second buffer layer and the first silicon layer; applying a continuously oscillating laser beam having a wavelength at which the laser beam is absorbed in silicon to the patterned first silicon layer to melt and crystallize the first silicon layer; and forming a thin film transistor by using the crystallized first silicon layer.

With this thin film transistor manufacture method, a fraction of the energy of an applied laser beam is absorbed in the heat accumulating-light shielding layer and stored therein as heat. Since a temperature difference between the heat accumulating-light shielding layer and the melted first silicon layer becomes small, an amount of heat radiation to the layers lower than the melted first silicon layer reduces so that a cooling speed is relaxed. Even if a semiconductor layer has a thickness of 100 nm or thinner, an average crystal grain diameter is 1 μm or larger and this semiconductor layer can be changed to a polycrystalline layer having large crystal grains.

According to another aspect of the invention, there is provided a thin film transistor comprising: an insulating substrate; a first insulating buffer layer formed on a surface of the insulating substrate; a light shielding layer formed on a surface of the first insulating buffer layer; a second insulating buffer layer formed on a surface of the light shielding layer; a first silicon layer formed on a surface of the second insulating buffer layer; a gate insulating film formed on a surface of the first silicon layer; a gate electrode formed on a surface of the gate insulating film; and source/drain electrodes electrically connected to the first silicon layer on both sides of the gate electrode, wherein the light shielding layer is made of silicon or is made of an upper layer and a lower layer, the lower layer being a metal layer of refractory metal selected from a group consisting of molybdenum, titanium, neodymium, tungsten and tantalum or alloy containing the selected refractory metal or metals, or a silicide layer of the selected refractory metal or metals, and the upper layer being a silicon layer formed on the lower layer.

The first silicon layer of this thin film transistor is made of crystals having a large grain size. The first silicon layer can be made as thin as 100 nm or thinner. An operation speed of the transistor is therefore high. Even if this transistor is used with a peripheral circuit of a liquid crystal display device having a back light, the light shielding layer prevents the generation of leak current to be caused by the back light.

According to still another aspect of the present invention, there is provided a method of manufacturing a thin film transistor comprising the steps of: laminating a first insulating buffer layer, a first silicon layer, a second insulating buffer layer and a second silicon layer on an insulating substrate in a recited order from a bottom; removing the second silicon layer and the second insulating buffer layer in a first area to expose the first silicon layer; patterning a lamination structure of the second insulating buffer layer and the second silicon layer in a second area; applying a pulsated laser beam to the exposed first silicon layer in the first area to crystallize the first silicon layer in the first area; applying a continuously oscillating laser beam to the patterned second silicon layer in the second area to melt, solidify and crystallize the second silicon layer in the second area; and forming thin film transistors by using the crystallized first and second silicon layers.

With this thin film transistor manufacture method, it is possible to manufacture at the same time two types of transistors having a semiconductor layer having different silicon crystal grain diameters and different layer structures. It is easy to manufacture elements having different characteristics by using the first and second silicon layers. For example, by using one silicon layer, it is possible to manufacture thin film transistors capable of high speed operation to be used in a peripheral circuit of a liquid crystal display device. By using the other silicon layer, it is possible to manufacture thin film transistors with small steps and small leak current to be used in a pixel display circuit of the liquid crystal display device.

According to still another aspect of the present invention, there is provided a display device having pixel drive transistors and peripheral circuit transistors for controlling operations of the pixel drive transistors, wherein: the peripheral circuit transistor comprises an insulating substrate, a first insulating buffer layer formed on a surface of the insulating substrate, a first silicon layer formed on a surface of the first insulating buffer layer, a second insulating buffer layer formed on a surface of the first silicon layer and a second silicon layer formed on a surface of the second insulating buffer layer, the second silicon layer being an active layer of the peripheral circuit transistor; and the pixel drive transistor comprises a third silicon layer formed on the surface of the first insulating buffer layer, the third silicon layer being a same layer as the first silicon layer and an active layer of the pixel drive transistor. A transistor for a peripheral circuit of this display device has a high operation speed and prevents leak current to be caused by a back light.

As above, it is possible to provide a high quality thin film transistor and its manufacture method, particularly a polysilicon thin film transistor of high quality and small leak current to be caused by light, its efficient manufacture method, and a display device using such polysilicon thin film transistors.

DESCRIPTION OF THE PREFERRED EMBODIMENTS

Figure 1A:
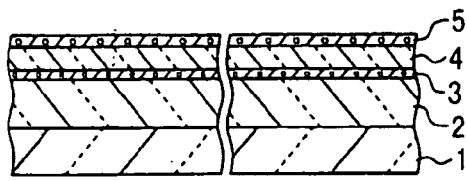
FIGS. 1A to 1G are schematic cross sectional views illustrating a thin film transistor manufacture method according to a first embodiment of the invention.

FIGS. 1A to 1G are schematic cross sectional views illustrating a thin film transistor manufacture method according to the first embodiment of the invention. Referring first to FIG. 1A, formed on an insulating substrate 1 made of, e.g., glass having a heat resistance temperature of 650° C. are a first buffer layer 2, a heat accumulating-light shielding layer 3, a second buffer layer 4 and a semiconductor layer 5 stacked in this order from the bottom by chemical vapor deposition (CVD). For example, the first buffer layer 2 is made of silicon oxide (SiO) and has a thickness of 400 nm, the heat accumulating-light shielding layer 3 is made of amorphous silicon and has a thickness of 50 nm, the second buffer layer 4 is made of silicon oxide and has a thickness of 100 nm, and the semiconductor layer 5 is made of amorphous silicon and has a thickness of 75 nm.

Figure 1B:
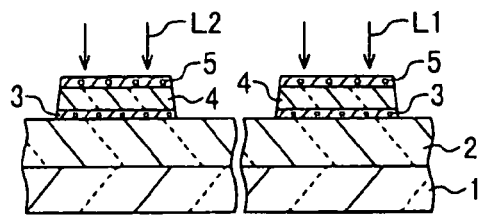

Referring to FIG. 1B, the heat accumulating-light shielding layer 3, second buffer layer 4 and semiconductor layer 5 are worked by photolithography and etching to pattern them into generally the same shape, e.g., a rectangular plan shape having a vertical length of 100 μm and a horizontal length of 200 μm. Thereafter, laser beams L1 and L2 are applied to the semiconductor layers 5 made of amorphous silicon to crystallize it.

For polycrystallizing the semiconductor layer 5 in the left area shown in FIG. 1B, a second order harmonics wave L2 (wavelength of 532 nm) of a continuously oscillating Nd:YVO$_4$ laser beam is used. The power of laser beam is set to 6 W for example. A laser beam having an elongated beam spot shape of, e.g., a length of 400 μm and a width of 40 μm, is applied while it is scanned along a beam spot width direction at a speed of about 200 mm/sec for example. Upon application of the laser beam, the semiconductor layer 5 made of amorphous silicon is melted and crystallized when it is hardened to form a polycrystalline layer.

While the laser beam is applied to the semiconductor layer 5, a fraction of the energy of the laser beam passes through the semiconductor layer 5 and second buffer layer 4 and absorbed in the heat accumulating-light shielding layer 3 and stored therein as heat. The temperature of the heat accumulating-light shielding layer 3 therefore rises. A heat radiation amount of the melted semiconductor layer 5 relative to the underlying layers is reduced so that the cooling speed is relaxed. Even if the semiconductor layer 5 has the thickness of 75 nm, the average crystal grain diameter is 1 μm or larger. Polycrystallization with large crystal grain diameter is therefore possible.

By inserting the layer made of silicon and having the heat accumulating effect under the semiconductor layer 5, the semiconductor layer 5 thinner than 100 nm can be polycrystallized to have a large crystal grain diameter, being otherwise impossible unless such a layer is inserted.

Since the transistor formed in the left area by succeeding several processes has a thin active layer (semiconductor layer 5) and a large crystal grain diameter, leak current is small and an operation speed is high. By using such transistors with a device using a back light such as a liquid crystal display, an excellent operation performance can be retained and leak current to be caused by light can be reduced because of a thin active layer. These transistors are therefore suitable for use in a peripheral circuit of a liquid crystal display device.

For polycrystallizing the semiconductor layer 5 in the right area shown in FIG. 1B, a pulsated XeCl excimer laser wave L1 is used, for example, at a wavelength of 308 nm and a repetition frequency of 300 Hz. For example, this laser beam is applied to the surface of the semiconductor layer 5 at a fluence of 300 mJ/cm$^2$ and a superposing rate of 95%. Since the semiconductor layer 5 is relatively thin, 75 nm, polycrystallization by an excimer laser is possible. While the excimer laser is applied to the semiconductor layer in the right area, no problem occurs even if the laser beam is applied to the semiconductor layer in the left area.

The silicon crystal grain diameter of the semiconductor layer 5 in the right area is smaller than that of the semiconductor layer in the left area. No problem occurs even if transistors formed by using this semiconductor layer in the right area are used in the pixel display unit of a liquid crystal display device not requiring a high performance. Either continuously oscillating laser beam application for the left area or excimer laser beam application for the right area may be performed first.

As compared to the second order harmonics wave of a continuously oscillating Nd:YVO$_4$ laser beam, the excimer laser beam can achieve faster the crystallization of a semiconductor layer so that a large area semiconductor layer can be crystallized in a short time.

The rectangular pattern of the semiconductor layer 5 defines the area in which silicon melted and fluidized by laser beam application flows so that the thicknesses of the polycrystallized semiconductor layers 5 can be made uniform. The rectangular size is determined from the size and the number of transistors to be formed. In this embodiment, for example, one transistor is formed in one rectangular area.

Figure 1C:
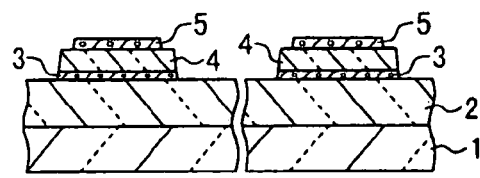

Referring to FIG. 1C, the polycrystallized semiconductor layers 5 in the right and left areas are shaped by photolithography and etching, in accordance with the size and shape of each transistor to be formed.

Figure 1D:
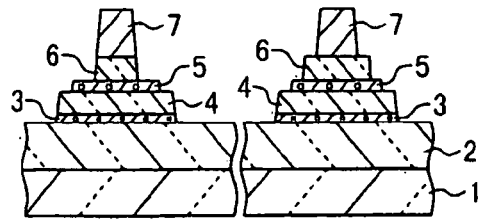

Referring to FIG. 1D, a layer for a gate insulating film 6 and a layer for a gate electrode 7 are formed. For example, the layer for the gate insulating film 6 is formed by CVD, the layer being made of silicon oxide (SiO) and having a thickness of 150 nm. The layer for the gate electrode 7 is formed by sputtering or electron beam vapor deposition, the layer being made of chromium and having a thickness of 300 nm. The layers are then patterned by photolithography and etching. In this example, in the left area the gate insulating film 6 is worked to have the same width as that of the gate electrode 7, whereas in the right area the gate insulating film 6 is worked wider than that of the gate electrode 7.

Figure 1E:
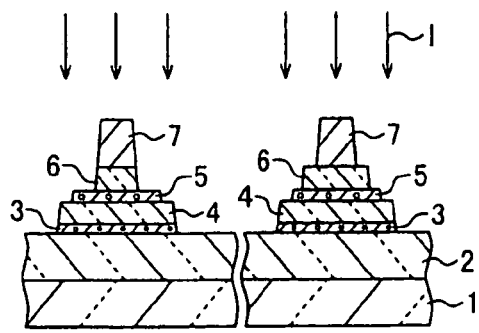

Referring to FIG. 1E, impurities I are doped by ion implantation into the semiconductor layers 5 in the right and left areas. Since the gate insulating film 6 has the same width as that of the gate electrode 7 in the left area, source/drain regions are formed in the semiconductor layer 5 outside of the gate electrode 7 as viewed in plan. Since the gate insulating film 6 is wider than that of the gate electrode 7 in the right area, offset or LDD regions are formed under the gate insulating film 6 protruded from the gate electrode 7 and source/drain regions are formed outside of the LDD regions, respectively as viewed in plan.

Figure 1F:
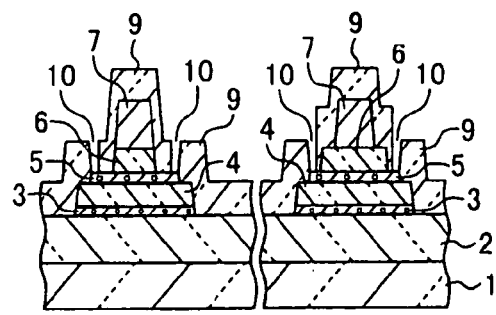

Referring to FIG. 1F, an interlayer insulating film 9 is formed over the insulating substrate 1 in both the right and left areas, covering the gate electrodes 7. For example, the interlayer insulating film 9 is made of a silicon oxide film formed by CVD or an organic insulating film formed by coating. Contact holes 10 are formed through the interlayer insulating film 9 by photolithography and etching to expose the surfaces of the semiconductor layer 5 on the bottoms of the contact holes.

Figure 1G:
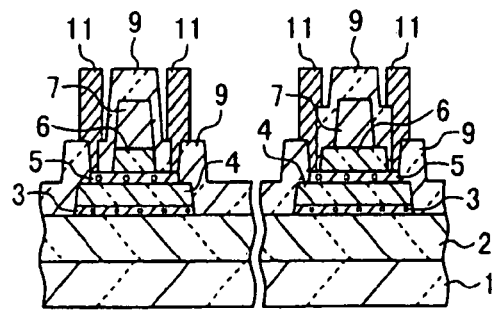

Referring to FIG. 1G, an electrode layer is formed by sputtering, electron beam vapor deposition or the like and patterned by photolithography and etching to form source/drain electrodes 11 in the contact holes 10 in the right and left areas.

Figure 4:
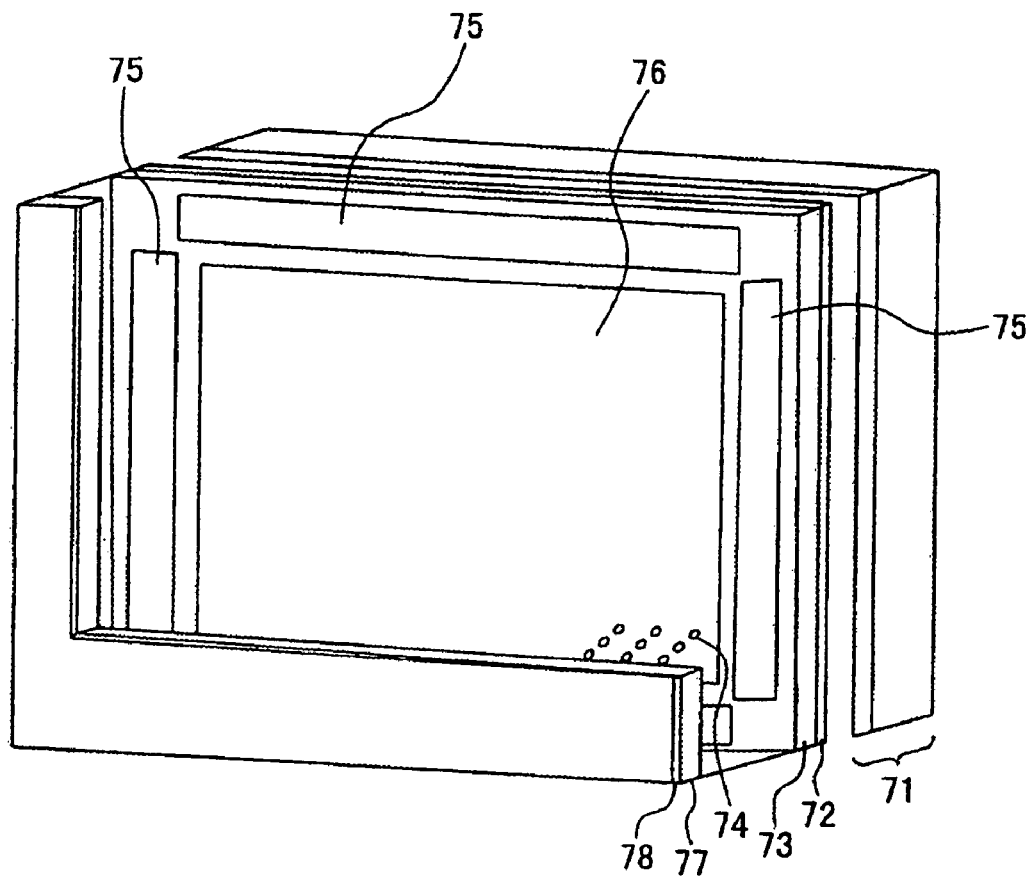
FIG. 4 is a schematic perspective view partially broken and showing an example of a liquid crystal display using polysilicon thin film transistors.

As thin film transistors manufactured by the above-described method are used for a liquid crystal display device such as shown in FIG. 4, the heat accumulating-light shielding layer 3 also shields back light so that leak current to be caused by light can be reduced further.

The structure of a thin film transistor is not limited only to that described above. For example, offset or LDD regions may be formed also for the transistors in the left area. The heat accumulating-light shielding layer 3 may not be made of only a silicon layer, but it may be made of a combination of a silicon layer and a thermally stable refractory metal layer made of, for example, molybdenum, titanium, neodymium, tungsten or tantalum. In this case, the heat accumulating-light shielding layer 3 is made of a silicon film as its upper layer (nearer to the semiconductor layer 5) and a refractory metal layer as its lower layer. The upper silicon film confronting the semiconductor layer 5 via the second buffer layer 4 has the heat accumulation effect so that crystals of the semiconductor layer 5 can be enhanced to have a large crystal grain diameter during laser beam application. When this thin film transistor is used with a liquid crystal display device such as shown in FIG. 4, the lower refractory metal layer shields perfectly light from the back light 71 to prevent the generation of leak current. Similar effects can also be obtained by using a silicon film as the upper layer of the heat accumulating-light shielding layer 3 and a refractory metal silicide layer as the lower layer.

In the first embodiment, one transistor is defined in the process shown in FIG. 1B in the area of the semiconductor layer 5 patterned in a rectangular shape, e.g., a vertical length of about 100 μm and a horizontal length of about 200 μm. Plural transistors can be defined in the area.

FIGS. 2A to 2H are schematic cross sectional views illustrating a thin film transistor manufacture method according to the second embodiment of the invention. With the manufacture method of the second embodiment, for example, transistors to be used with the peripheral circuit of a liquid crystal display device such as shown in FIG. 4 are manufactured in the left area in each drawing of FIGS. 2A to 2H, and switching transistors to be used with the pixel display unit are manufactured in the right area.

Figure 2A:
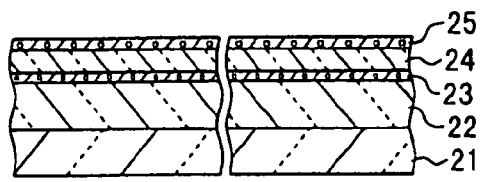
FIGS. 2A to 2H are schematic cross sectional views illustrating a thin film transistor manufacture method according to a second embodiment of the invention.

Referring to FIG. 2A, formed on an insulating substrate 21 are a first buffer layer 22, a first semiconductor layer 23, a second buffer layer 24 and a second semiconductor layer 25 stacked in this order from the bottom. For example, the first buffer layer 22 is made of silicon oxide (SiO) and has a thickness of 400 nm, the first semiconductor layer 23 is made of amorphous silicon and has a thickness of 50 nm, the second buffer layer 24 is made of silicon oxide (SiO) and has a thickness of 100 nm, and the second semiconductor layer 25 is made of amorphous silicon and has a thickness of 75 nm.

Figure 2B:
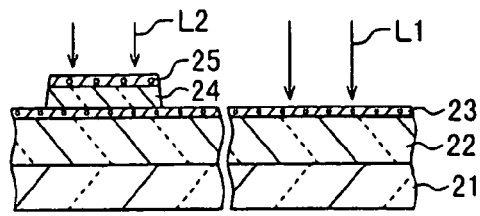

Referring to FIG. 2B, in the left area, the second buffer layer 24 and second semiconductor layer 25 are patterned in a similar manner to that described with reference to FIG. 1B. Thereafter, a second order harmonics wave L2 of a continuously oscillating Nd:YVO$_4$ laser beam is applied to the second semiconductor layer 25 to polycrystallize it. The power of a beam to be applied, the size of an elongated shape beam spot, the beam scan direction and speed are all similar to those of the first embodiment.

The first semiconductor layer 23 in the left area takes a similar role to that of the heat accumulating-light shielding layer 3 of the first embodiment. The second semiconductor layer 25 can therefore be polycrystallized to have an average crystal grain diameter of 1 μm or larger. From the same reasons as those described in the first embodiment, transistors formed in the left area are suitable for use with, for example, a peripheral circuit unit of a liquid crystal display device having a back light such as shown in FIG. 4. The off-current characteristics can be improved with a low off-current value.

The reason of the rectangular patterning of the second semiconductor layer 25 is the same as that described with the first embodiment.

In the right area, the second semiconductor layer 25 and second buffer layer 24 are removed to expose the surface of the first semiconductor layer 23. Thereafter, an XeCl excimer laser beam L1 is applied to the exposed surface of the first semiconductor layer 23 to polycrystallize it. A laser repetition frequency, a fluence per one pulse on a radiation surface and a superposing rate are similar to those of the first embodiment. Since the first semiconductor layer 23 is thin, 50 nm, the first semiconductor layer 23 can be polycrystallized properly by an excimer laser beam.

A silicon crystal grain diameter in the laser beam radiation area of the first semiconductor layer 23 in the right area is smaller than that in the left area. As described with reference to the first embodiment, no problem occurs even if transistors in the right area are used in the pixel display unit of a liquid crystal display device not requiring a high performance and having a back light such as shown in FIG. 4. In this case, since the first semiconductor layer 23 is thin, a rise in off-current of the back light can be suppressed.

As also described in the first embodiment, as compared to the second order harmonics wave of continuously oscillating Nd:YVO$_4$ laser, the excimer laser can achieve faster the crystallization of a semiconductor layer so that a large area semiconductor layer can be crystallized in a short time.

Figure 2C:
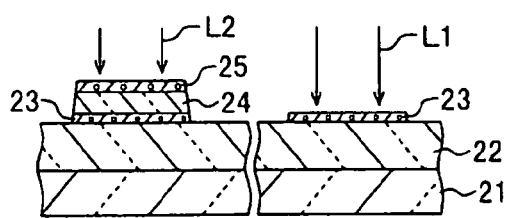

Referring to FIG. 2C, the following processes may be adopted in place of the process described with reference to FIG. 2B. In the processes illustrated in FIG. 2C, in the left area, the second buffer layer 24 and second semiconductor layer 25 as well as the first semiconductor layer 23 are patterned in a manner similar to that described with reference to FIG. 1B.

Also in the right area, the second buffer layer 24 and second semiconductor layer 25 are removed and thereafter, the first semiconductor layer 23 is patterned in a manner similar to that described with reference to FIG. 1B. These two points are different from the processes described with reference to FIG. 2B. The processes of crystallizing the second semiconductor layer 25 in the left area and the first semiconductor layer 23 in the right area by applying laser beams are similar to those described with reference to FIG. 2B.

By pattering beforehand the first semiconductor layer 23 in the left area, it is possible to prevent heat dissipation during application of a continuously oscillating laser beam and improve the heat accumulation effects of the first semiconductor layer 23.

Figure 2D:
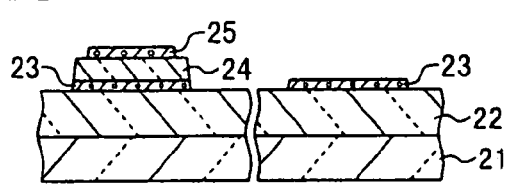

Referring to FIG. 2D, after the processes described with reference to FIG. 2B or 2C, the polycrystallized second semiconductor layer 25 in the left area and the polycrystallized first semiconductor layer 23 in the right area are shaped by photolithography and etching in accordance with the size and shape of transistors to be formed.

Figure 2E:
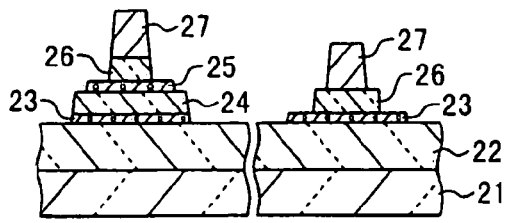

Referring to FIG. 2E, gate insulating films 26 and gate electrodes 27 are formed in the right and left areas in the manner similar to that described with reference to FIG. 1D.

Figure 2F:
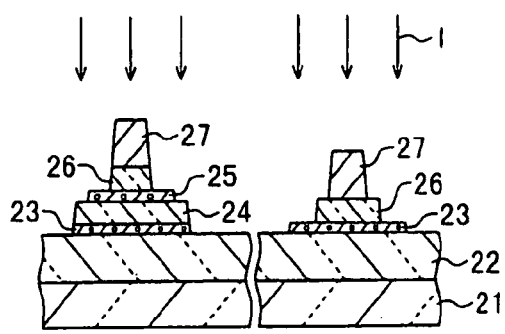

Referring to FIG. 2F, impurities I are doped by ion implantation into the semiconductor layers in the right and left areas (into the second semiconductor layer 25 in the left area and into the first semiconductor layer 23 in the right area). Offset or LDD areas are formed in partial regions of the first semiconductor layer 23 in the right area in the manner similar to that of the first embodiment described with reference to FIG. 1E.

Figure 2G:
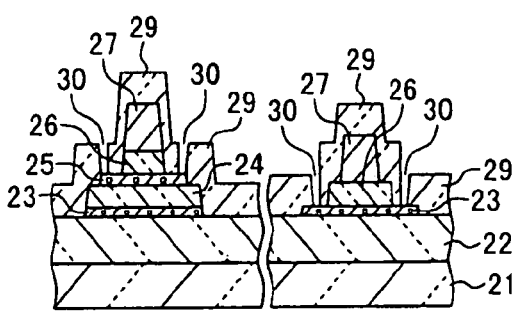

Referring to FIG. 2G, interlayer insulating films 29 are formed in the right and left areas in the manner similar to that of the first embodiment described with reference to FIG. 1F. Contact holes 30 are formed through the interlayer insulating films 29 to expose the surfaces of the semiconductor layer on the bottom surfaces of the holes (the surface of the second semiconductor layer 25 in the left area and the surface of the first semiconductor layer 23 in the right area).

Figure 2H:
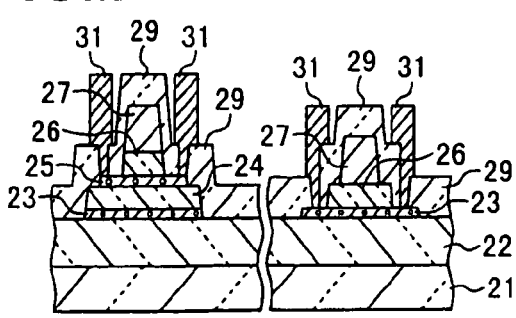
Figure 3:
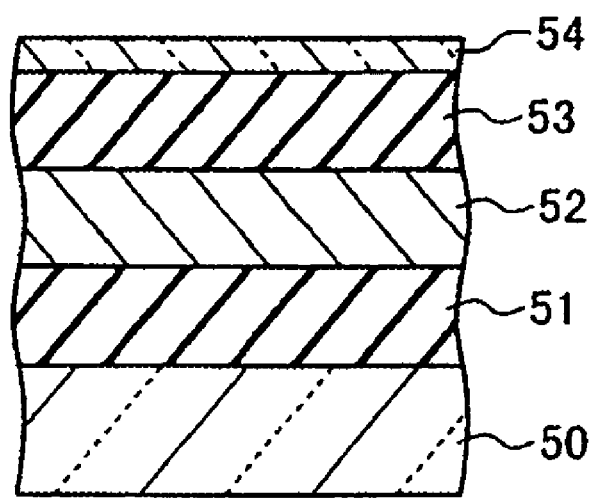
FIG. 3 is a schematic cross sectional view illustrating one process of a conventional thin film transistor manufacture method.

Referring to FIG. 2H, source/drain electrodes 31 are formed in the contact holes 30 in the right and left areas.

With this embodiment method, it is possible to manufacture transistors of two different types having different silicon crystal grain diameters and different structures of the semiconductor layers. Since both the first and second semiconductor layers 23 and 25 are made of silicon, transistors having the semiconductor layers of different characteristics can be formed easily.

The first semiconductor layer 23 (polysilicon layer having a small crystal grain diameter) used as the active layer of the transistor in the right area is formed thinner than the second semiconductor layer 25 (polysilicon layer having a large crystal grain diameter) used as the active layer of the transistor in the left area.

The structures of the transistors manufactured by the second embodiment method are not limited only to those described above. For example, Offset or LDD regions may be formed in partial regions of the second semiconductor layer 25 of the transistor in the left area.

A continuously oscillating laser beam may be used to crystallize the first semiconductor layer 23 in the right area, similar to crystallizing the second semiconductor layer 25 in the left area. In this case, for example, a second order harmonics wave (wavelength: 532 nm) of a continuously oscillating Nd:YVO$_4$ laser beam is applied at a power of 6 W. A laser beam having an elongated beam spot shape of, e.g., a length of 400 μm and a width of 40 μm is applied while it is scanned along a beam spot width direction at a speed of about 400 mm/sec for example. Since the thickness of the first semiconductor layer 23 is only 50 nm, the silicon crystals are not changed to have a large crystal grain diameter, but the crystal size is almost the same as that when crystallization is performed by using an excimer laser beam.

The first semiconductor layer 23 in the left area may be divided into a plurality of areas in each of which a plurality of transistors are formed by using the second semiconductor layer 25.

In the first and second embodiments, polycrystals of a large crystal grain diameter are formed by applying a second order harmonics wave of an Nd:YVO$_4$ laser beam to a silicon layer. A laser beam to be used may be a continuously oscillating laser beam having a wavelength at which the laser beam is absorbed in silicon, such as a second order harmonics wave of an Nd:YLF laser beam and a second order harmonics wave of an Nd:YAG laser beam. The laser beam has preferably a wavelength in the range from 380 nm to 540 nm, because glass absorbs the laser beam at the wavelength shorter than 380 nm and is broken and because silicon does not absorb sufficiently the laser beam at the wavelength longer than 540 nm and is not crystallized.

The present invention has been described in connection with the preferred embodiments. The invention is not limited only to the above embodiments. It will be apparent to those skilled in the art that other various modifications, improvements, combinations, and the like can be made.

What we claim are:

1. A display device having pixel drive transistors and peripheral circuit transistors for controlling operations of said pixel drive transistors, wherein:

said peripheral circuit transistor comprises an insulating substrate, a first insulating buffer layer formed on a surface of said insulating substrate, a first silicon layer formed on a surface of said first insulating buffer layer;

a second insulating buffer layer formed on a surface of said first silicon layer and a second silicon layer formed on a surface of said second insulating buffer layer, said second silicon layer being an active layer of said peripheral circuit transistor; and said pixel drive transistor comprises a third silicon layer formed on the surface of said first insulating buffer layer, said third silicon layer being a same layer as said first silicon layer and an active layer of said pixel drive transistor, and wherein said third silicon layer is made of polycrystalline grains whose average crystal grain diameter is smaller than an average crystal grain diameter of said second silicon layer.

2. The display device according to claim 1, wherein said first and third silicon layers are formed thinner than said second silicon layer.

3. The display device according to claim 1, wherein said first silicon layer of said peripheral circuit transistor is divided into a plurality of areas in each of which a plurality of transistors are formed.

* * * * *